(12) United States Patent
Miyazawa et al.

(10) Patent No.: US 8,994,704 B2
(45) Date of Patent: Mar. 31, 2015

(54) LATCH CIRCUIT AND DISPLAY DEVICE USING THE LATCH CIRCUIT

(75) Inventors: Toshio Miyazawa, Chiba (JP);
Mitsuhide Miyamoto, Chiba (JP)

(73) Assignee: Pixtronix, Inc., San Diego, CA (US)

( * ) Notice: Subject to any disclaimer, the term of this patent is extended or adjusted under 35 U.S.C. 154(b) by 112 days.

(21) Appl. No.: 13/429,476

(22) Filed: Mar. 26, 2012

(65) Prior Publication Data
US 2012/0287101 A1 Nov. 15, 2012

(30) Foreign Application Priority Data

May 12, 2011 (JP) ................. 2011-106895

(51) Int. Cl.
*G06F 3/038* (2013.01)
*G09G 5/00* (2006.01)
*H03K 3/356* (2006.01)

(52) U.S. Cl.
CPC .............. *H03K 3/356095* (2013.01)
USPC .............. 345/204; 345/76; 345/82; 345/104; 345/211; 315/169.1; 315/169.2; 315/169.3; 315/169.4

(58) Field of Classification Search
CPC ................................ H03K 3/356095
USPC ............ 345/36, 39, 45–47, 76–83, 104, 204, 345/211; 315/169.1–169.4
See application file for complete search history.

(56) References Cited

U.S. PATENT DOCUMENTS

| | | |
|---|---|---|
| 2006/0250325 A1 | 11/2006 | Hagood et al. |
| 2008/0158110 A1* | 7/2008 | Iida et al. .................. 345/76 |
| 2009/0237123 A1* | 9/2009 | Jinta ........................ 327/108 |

FOREIGN PATENT DOCUMENTS

| | | |
|---|---|---|
| CN | 1886896 A | 12/2006 |
| CN | 1965340 A | 5/2007 |
| GB | 2459661 A | 11/2009 |
| JP | 2008501994 A | 1/2008 |
| JP | 2008-197668 | 8/2008 |
| KR | 20050075116 A | 7/2005 |
| KR | 20080061268 A | 7/2008 |
| KR | 20090100289 A | 9/2009 |
| TW | 200523854 | 7/2005 |
| TW | 200836152 A | 9/2008 |
| TW | 200945294 A | 11/2009 |
| WO | WO 2005/122121 | 12/2005 |
| WO | WO 2006/091738 A1 | 8/2006 |

OTHER PUBLICATIONS

European Search Report—EP12161034—Search Authority—Munich—Jun. 8, 2012.
Taiwan Search Report—TW101110255—TIPO—Aug. 22, 2014.

* cited by examiner

*Primary Examiner* — Kumar Patel
*Assistant Examiner* — Insa Sadio
(74) *Attorney, Agent, or Firm* — Edward A. Gordon; Foley & Lardner LLP

(57) ABSTRACT

A latch circuit includes an input transistor, a retention capacitor connected between an electrode of the input transistor and a first latch control line, a first transistor having an electrode connected to the first latch control line and a gate connected to the electrode of the input transistor, a second transistor having a gate connected to another electrode of the first transistor and an electrode is connected to the second latch control line, a third transistor having a gate connected to the another electrode of the first transistor and an electrode connected to another electrode of the second transistor and another electrode connected to an output terminal.

14 Claims, 10 Drawing Sheets

LATCH CIRCUIT AND DISPLAY DEVICE USING THE LATCH CIRCUIT

CROSS REFERENCE TO RELATED APPLICATION

This application is based upon and claims the benefit of priority from the prior Japanese Patent Application No. 2011-106895, filed on 12 May, 2011, the entire contents of which are incorporated herein by reference.

FIELD

The present invention relates to a latch circuit and display device using a latch circuit and in particular, a single channel latch circuit which forms the latch circuit using either an n type MOS transistor or p type MOS transistor, and a display device using the single channel latch circuit.

BACKGROUND

Recently, a latch circuit is usually structured by a CMOS circuit, for example, a general latch circuit is shown in FIG. 8 which is formed using an N type MOS transistor (NMT93, NMT94) connected between a power supply line (LVDD) supplied with a voltage VDD which is a predetermined voltage, and a power supply line (LGND) supplied with a voltage GND which is a ground voltage, and a p type MOS transistor (PMT95, PMT96).

In FIG. 9, the time change of a scanning voltage ($\phi$G), a drive clock ($\phi$AC) and each node (N91, N92, N93, N94) are shown.

First, the case where a voltage (data) on a data line (LD) is a Low level (below referred to as L level) voltage VL is explained.

As is shown in FIG. 9, when a scanning voltage ($\phi$G) on a scan line (LG) changes from an L level voltage VL to a High voltage (below referred to a H level) VH1 at time (t1), the n type MOS transistor (NMT91) is switched on and the voltage (data: voltage VL at time (t1)) on the data line (LD) is applied to a retention capacitance (CD). In this way, node (N91) becomes at the voltage VL.

Next, at time (t2), when the drive clock ($\phi$AC) on a latch control line (LAC) changes from a L level voltage VL to a H level voltage VH2, the n type MOS transistor (NMT92) is switched on and the node (N94) becomes at the voltage VL.

In this way, the p type MOS transistor (PMT95) and the n type MOS transistor (NMT94) are switched on, the p type MOS transistor (PMT96) and the n type MOS transistor (NMT93) are switched off, the node (N92), that is, second output (OUT2), becomes at a voltage GND, and the node (N93), that is, first output (OUT1), becomes at a voltage VDD. Therefore, the output of the first output (OUT1) becomes at a H level and the output of the second output (OUT2) becomes at a L level.

Next, the case where a voltage (data) on a data line (LD) is a H level voltage VDH is explained.

As is shown in FIG. 9, when a scanning voltage ($\phi$G) on a scan line (LG) changes from an L level voltage VL to a H level voltage VH1 at time (t3), the n type MOS transistor (NMT91) is switched on and the voltage (data: voltage VDH at time (t3)) on the data line (LD) is applied to a retention capacitance (CD). In this way, node (N91) becomes at the voltage VH3.

Next, at time (t4), when the drive clock ($\phi$AC) on a latch control line (LAC) changes from a L level voltage VL to a H level voltage VH2, the n type MOS transistor (NMT92) is switched on and the node (N94) becomes at the voltage VH4.

In this way, the n type MOS transistor (NMT93) and the p type MOS transistor (NMT96) are switched on, the p type MOS transistor (PMT95) and the n type MOS transistor (NMT94) are switched off, the node (N92), that is, second output (OUT2), becomes at a voltage VDD, and the node (N93), that is, first output (OUT1), becomes at a voltage GND. Therefore, the output of the first output (OUT1) becomes at a L level and the output of the second output (OUT2) becomes at a H level.

Furthermore, as is shown in FIG. 9, the voltages VDD and GND are fixed.

As an example of specific usage method of the latch circuit shown in FIG. 8, is the usage method shown in FIG. 10 whereby a pixel circuit of a display (below, referred to as movable shutter type display) which displays an image by electrically controlling the position of a movable shutter (S) using the two outputs (first output OUT1, second output OUT2) of the latch circuit. Furthermore, the movable shutter type display is also called a MEMS (Mechanical Electro Mechanical Systems) shutter type display. In addition, a movable shutter type display is disclosed in Patent Document 1 (Japanese Laid-Open Patent Publication No. 2008-197668) for example.

In the pixel circuit of the movable shutter type display shown in FIG. 10, the movable shutter (S) moves at a high speed in an electrical field direction. As a result, in the case where the node (N92) is a voltage GND, and the node (N93) is a voltage VDD, the movable shutter (S) moves to the node (N93) side, and in the case where the node (N92) is a voltage VDD, and the node (N93) is a voltage GND, the movable shutter (S) moves to the node (N92) side at a high speed.

In addition, the light emitting state and non-light emitting state of a pixel are controlled by opening and closing of the movable shutter (S). In a movable shutter type display which includes a back light, for example, in the case where the movable shutter (S) moves to the node (N92) side, the light of the back light becomes transmissive and a pixel becomes a light emitting state, and in the case where the movable shutter (S) moves to the node (N93) side, the light of the back light becomes non-transmissive and a pixel becomes a non-light emitting state.

In this way, in a liquid crystal display device, the same as an operation whereby a liquid crystal layer controls the output light, the movable shutter (S) controls the light output from a pixel and thereby it is possible to display an image. Furthermore, in FIG. 10, LSS is a movable shutter control line and $\phi$S is a movable shutter control signal. The movable shutter control signal ($\phi$S) is a predetermined fixed voltage. In addition, an s voltage is also possible, as in an inversion drive of a liquid crystal display device.

In the pixel circuit of the movable shutter type display shown in FIG. 10, data is programmed to each pixel in row units within a programming period (TA in FIG. 9), and the movable shutter (S) is moved to the node (N92) or node (N93) within a movable shutter state setting time period (TB in FIG. 9) and an image is displayed in the display time period (TC in FIG. 9).

A MOS transistor including polysilicon semiconductor layers is used in the case where a latch circuit is formed using a CMOS circuit as is shown in FIG. 8.

However, because a CMOS manufacturing process which uses a MOS transistor including polysilicon semiconductor layers usually requires six to ten photolithography processes, the structure of a latch circuit formed using a conventional CMOS circuit puts a significant burden on the manufacturing process. However, by using a single channel transistor structure for the CMOS circuit using either an n type MOS transistor or p type MOS transistor, it is possible to reduce to the number photolithography processes by about two and thus reduce the burden on the manufacturing process.

Furthermore, when a MOS transistor formed with amorphous silicon semiconductor layers is used, it is possible to further reduce process costs than in the case where a MOS transistor formed with polysilicon semiconductor layers is used.

The present invention was conceived based on the knowledge described above, and aims to provide a latch circuit and display device using the latch circuit which can reduce the burden on the manufacturing process. Furthermore, it is also an aim of the present invention to provide a single channel latch circuit which latches latch data in relatively short period intervals and a display device which uses the single channel latch circuit.

The aims of the present invention, other aims and new features will be made clear in the description of the present specification and attached diagrams.

SUMMARY

A summary of a representative invention among the inventions disclosed in the present application is simply explained as follows.

(1) A latch circuit for receiving and latching data in response to an input scanning signal comprising:

a first latch control line receiving a first drive clock;

a second latch control line receiving a second drive clock;

an input transistor having a gate, a first and second electrodes, the first electrode of the input transistor receiving a data signal corresponding to [0] data or [1] data in response to the scanning signal supplied to the gate of the input transistor;

a first capacitor retaining a voltage of the data signal received by the input transistor, the first capacitor being connected between the second electrode of the input transistor and the first latch control line;

a first transistor having a gate, a first and second electrodes, the first transistor being a first conductivity type, the first electrode of the first transistor being connected to the first latch control line and the gate of the first transistor being connected to the second electrode of the input transistor;

a second transistor having a gate, a first and second electrodes, the second transistor being the first conductivity type, the gate of the second transistor being connected to the second electrode of the first transistor and the first electrode of the second transistor being connected to the second latch control line;

a third transistor having a gate, a first and second electrodes, the third transistor being the first conductivity type, the gate of the third transistor being connected to the second electrode of the first transistor, the first electrode of the third transistor being connected to the second electrode of the second transistor, and the second electrode of the third transistor being connected to an output terminal;

a second capacitor connected between the second electrode of the first transistor and the second electrode of the second transistor; and a diode connected between the second electrode of the first transistor and the first latch control line.

(2) The latch circuit in (1), the first drive clock changes from a first voltage to a second voltage after the scanning signal is input, the second drive clock changes from the first voltage to the second voltage after the first drive clock changes from the first voltage to the second voltage, the second drive clock changes from the second voltage to the first voltage after the first drive clock changes from the second voltage to the first voltage, and the voltage of the output terminal changes to the second voltage in response to the second drive clock changed from the first voltage to the second voltage, and the voltage of the output terminal changes to the second voltage or the first voltage according to an on or off state of the first transistor in response to the second drive clock changed from the second voltage to the first voltage.

(3) A latch circuit for receiving and latching data in response to an input scanning signal comprising:

a first latch control line receiving a first drive clock;

a second latch control line receiving a second drive clock;

an input transistor having a gate, a first and second electrodes, the first electrode of the input transistor receiving a data signal corresponding to [0] data or [1] data in response to the scanning signal supplied to the gate of the input transistor;

a first capacitor retaining a voltage of the data signal received by the input transistor, the first capacitor being connected between the second electrode of the input transistor and the first latch control line;

a first transistor having a gate, a first and second electrodes, a first transistor being a first conductivity type, the first electrode of the first transistor being connected to the first latch control line and the gate of the first transistor being connected to the second electrode of the input transistor;

a second transistor having a gate, a first and second electrodes, the second transistor being the first conductivity type, the gate of the second transistor being connected to the second electrode of the first transistor and the first electrode of the second transistor being connected to the second latch control line; and a diode connected between the second electrode of the first transistor and the first latch control line.

(4) The latch circuit in (3) wherein the first drive clock changes from a first voltage to a second voltage after the scanning signal is input, the second drive clock changes from a third voltage to a fourth voltage after the first drive clock changes from the first voltage to the second voltage, the second drive clock changes from the fourth voltage to the third voltage after the first drive clock changes from the second voltage to the first voltage, and the voltage of the output terminal becomes the fourth voltage when the second drive clock changes from the third voltage to the fourth voltage, and becomes the fourth voltage or third voltage according to an on or off state of the first transistor when the second drive clock changes from the fourth voltage to the third voltage.

(5) The latch circuit in (3) wherein the first drive clock changes from a first voltage to a second voltage after the scanning signal is input, the second drive clock changes from the third voltage to the fourth voltage after the first drive clock changes from the first voltage to the second voltage, the second drive clock changes from the fourth voltage to the third voltage after the first drive clock changes from the second voltage to the first voltage, and $|VH1| \geq |VH2 + 2 \times Vth|$ is satisfied when the second voltage of the first drive clock is VH1, the fourth voltage of the second drive clock is VH2 and Vth is a threshold voltage of a transistor.

(6) The latch circuit in (1) or (3) wherein the diode is formed by a diode-connected transistor, and the input transistor, the first transistor, the second transistor and the diode are thin film transistors formed by amorphous silicon semiconductor layers.

(7) The latch circuit in (2) or (4) wherein the diode is formed by a diode-connected transistor, and the input transistor, the first transistor, the second transistor and the diode are n type transistors and the second voltage is a voltage having a higher potential than the first voltage, and the fourth voltage is a voltage having a higher potential than the third voltage.

(8) A display device arranged with a plurality of pixels each having a movable shutter, the display device displaying an image by electrically controlling a position of the movable shutter, and each pixel includes a pixel circuit electrically controlling a position of the movable shutter, the pixel circuit including a first terminal, a second terminal, a third latch control line connected to the second output terminal of the pixel circuit and receiving a third drive clock, and the latch circuit according to any one of (1) to (7).

(9) The display device in (8), wherein the third drive clock changes to a first voltage from a second voltage and changes from the first voltage to the second voltage, and the third drive clock is confirmed to be a voltage output from the latch circuit to the first output terminal within a time period of the first voltage.

The effects obtained by a representative invention among the inventions disclosed in the present application are simply explained as follows.

According to the present invention, it is possible to provide a latch circuit and display device using the latch circuit which can reduce the burden on the manufacturing process. Furthermore, it is also possible to provide a single channel latch circuit which latches latch data in relatively short period intervals and a display device which uses the single channel latch circuit.

DESCRIPTION OF THE EMBODIMENTS

The embodiments of the present invention are explained in detail below while referring to the diagrams.

In all the diagrams for explaining the embodiments, elements having the same functions are attached with the same reference symbols and are therefore, repeated explanations are omitted. In addition, the embodiments explained below are not for limiting an interpretation of the scope of the appended claims of the present invention.

Embodiment One

Figure 1:
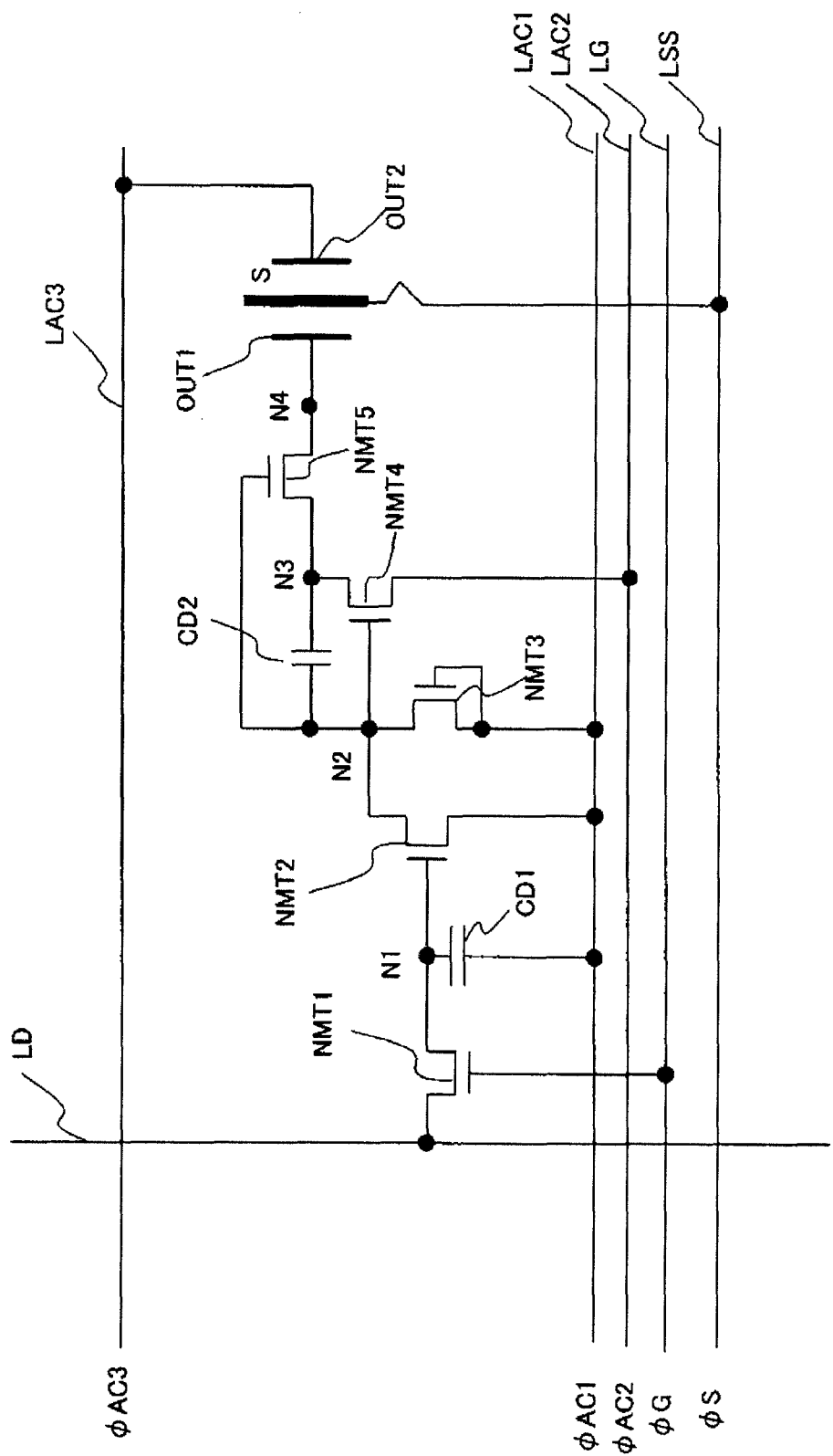
FIG. 1 is a circuit diagram which shows a circuit structure of a single channel latch circuit of embodiment one of the present invention.

FIG. 1 is a circuit diagram which shows a circuit structure of a single channel latch circuit (below referred to simply as latch circuit) of embodiment one of the present invention. The latch circuit of the present embodiment is a signal channel MOS transistor formed by only an n type MOS transistor (NMT*) (below referred to simply as transistor). Furthermore, the n type MOS transistor (NMT*) of the present embodiment is a thin film transistor (below referred to as a-Si transistor) including amorphous silicon semiconductor layers.

In addition, in FIG. 1, CD1, CD2 are capacitors, LD is a data line, LG is a scanning line, LAC 1 is a first latch control line receiving a first drive clock ($\phi AC1$), LAC2 is a second latch control line receiving a second drive clock ($\phi AC2$), and LAC3 is a third latch control line receiving a third drive clock ($\phi AC3$).

In a circuit (what is a called a dynamic circuit) which uses charging and discharging of a capacitor, either increasing the gate width of a transistor and increasing the total amount of current flow, or increasing a gate voltage and increasing the amount of current per unit surface area are general methods which use an a-Si transistor which has a small amount of movement and which secures a desired operation speed.

Figure 3:
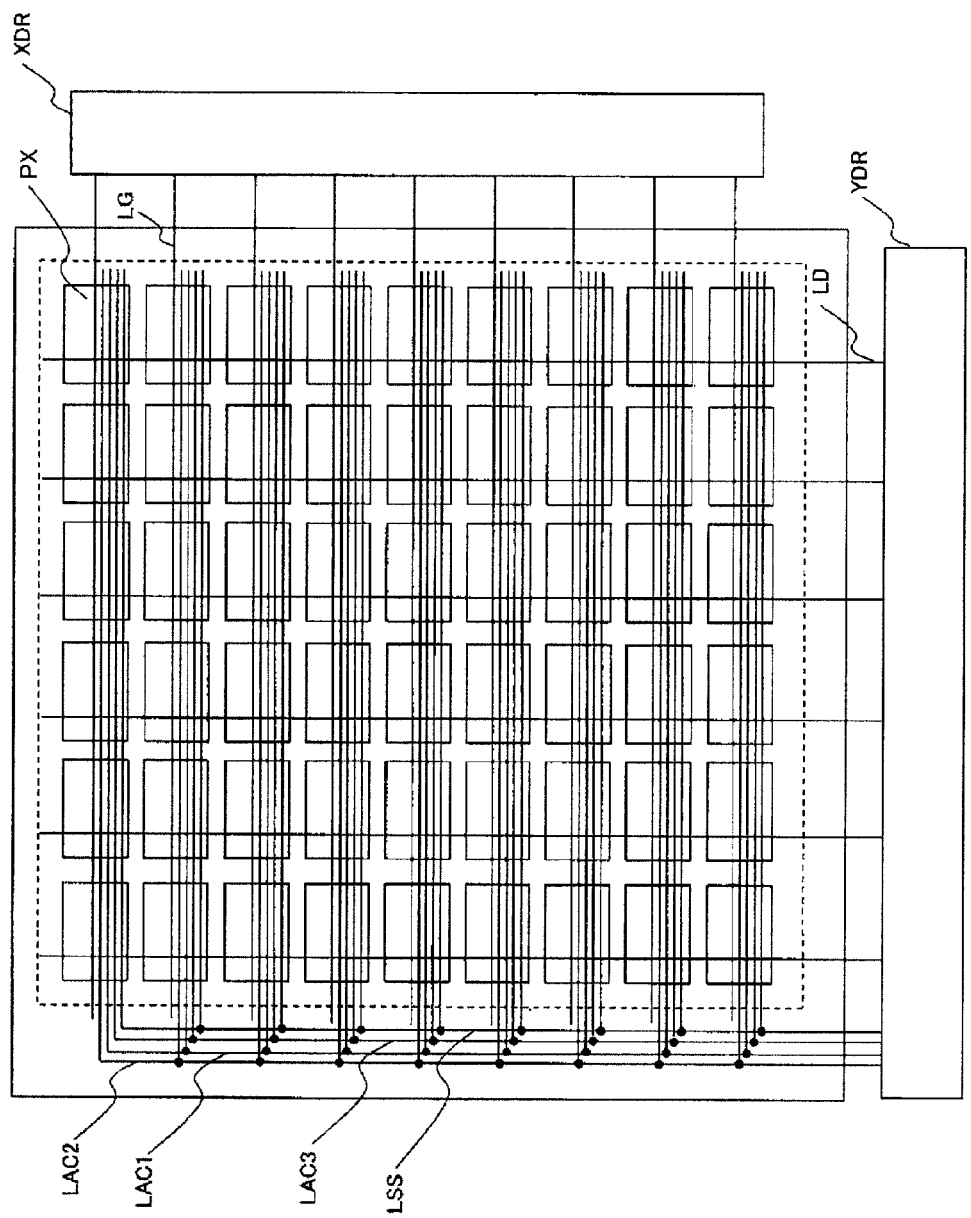
FIG. 3 is a block diagram which shows an approximate structure of a display which displays an image by electrically controlling the position of a movable shutter (S) of embodiment one of the present invention.

However, as is shown in FIG. 3 described below, because it is not practical to increase the gate width (for example, by 100 times) in a circuit which is formed within a pixel allocated with a certain area, a desired operation speed is realized by increasing the gate voltage and increasing the amount of current per unit surface area.

Figure 2:
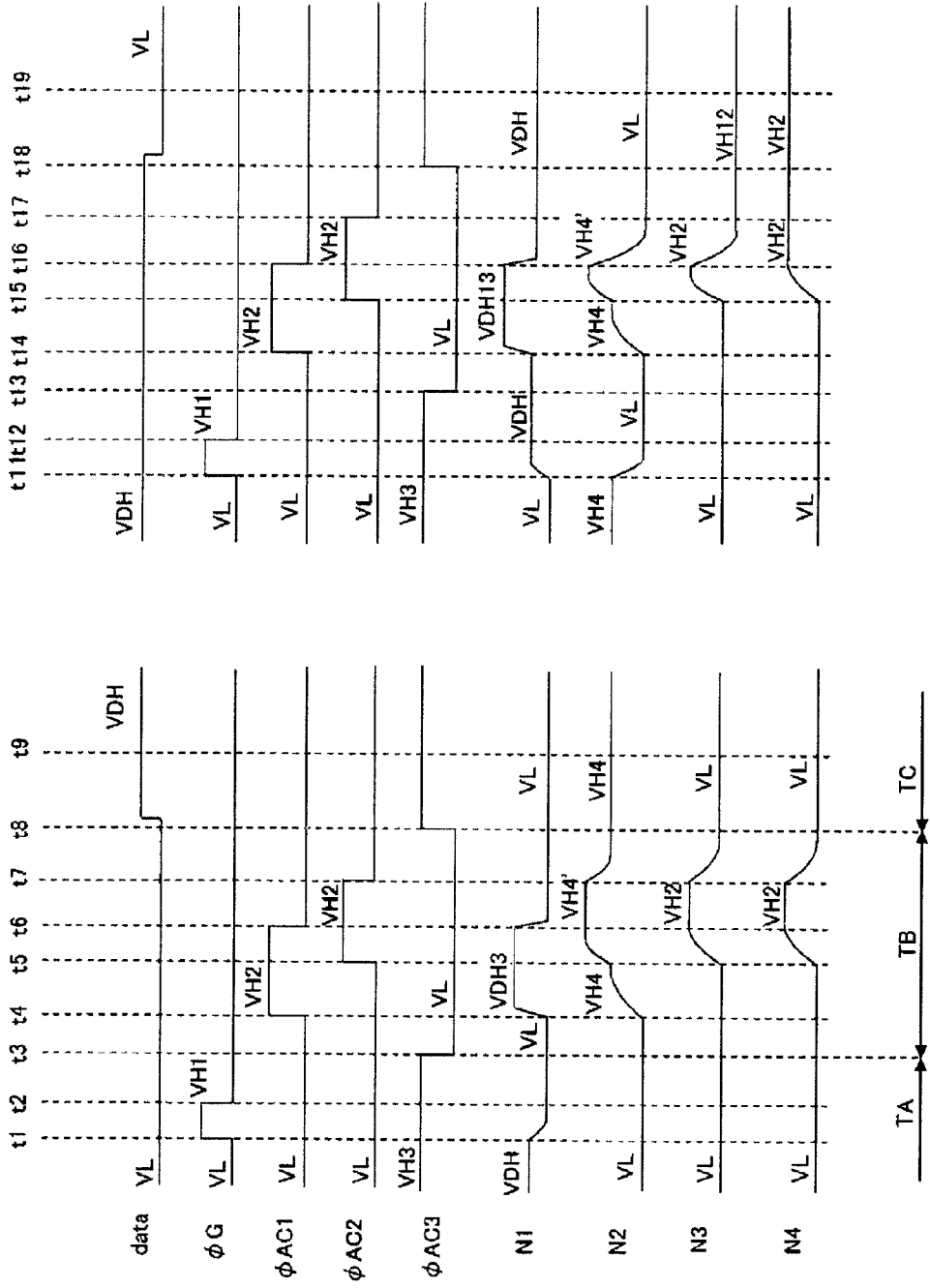
FIG. 2 is a timing chart which shows the time changes of a scanning voltage ($\phi G$), drive clock ($\phi AC1 \sim \phi AC3$), and each node (N1, N2, N3 and N4) of the latch circuit in embodiment one of the present invention.

FIG. 2 is a timing chart which shows the time changes of a scanning voltage ($\phi G$), drive clock ($\phi AC1 \sim AC3$), and each node (N1, N2, N3 and N4) of the latch circuit shown in FIG. 1.

At time (t1), when a scanning voltage ($\phi G$) (what is called a programming pulse (gate pulse)) on a scan line (LG) changes from a Low level voltage (referred to as L level below) VL to a High level voltage (below referred to a H level) VH1 (also called "a scanning voltage is input"), an input transistor (NMT1) is switched on and the voltage of the node (N1) becomes the voltage (data: voltage VL at time (t1)) on the data line (LD).

At time (t2), when the scanning voltage ($\phi G$) on the scan line (LG) changes to a L level voltage VL, the transistor (NMT1) is switched off and a programming operation to the node (N1) is complete.

In order to perform sufficient programming between time (t1) and time (t2), it is preferable that the H level voltage VH1 of the scanning voltage ($\phi G$) is a high voltage about 10V higher than the H level voltage VHD on the data line (LD) to match the transistor size of the transistor (NMT1). In the present embodiment, it is preferred that the voltage VH1 is 15V or more.

At time (t3), the third drive clock (φAC3) on the third latch control line (LAC3) changes from a H level voltage VH3 to a L level voltage VL (for example 0V). In the case where the latch circuit of the present embodiment is used as the movable shutter type display described above for example, at this point in time, the position of the shutter (S) moves to an intermediate position between the first output (OUT1) and second output (OUT2) with the force of a spring.

Next, at time (t4), when the first drive clock (φAC1) on the first latch control line (LAC1) changes from a L level voltage VL to a H level voltage VH2, because the transistor (NMT3) is diode-connected in which a current (a sequential direction current) flows from the first latch control line (LAC1) to the node (N2), the transistor (NMT2) becomes an on state and the voltage of node (N2) is raised.

The final voltage VH4 of the node (N2) is expresses by the following equation (1).

$$VH4 = VH2 - Vth \tag{1}$$

Here, Vth is a threshold voltage of the transistor (NMT3). For example, when a voltage VH2 is set at 25V and an effective Vth added with a charge time of a charge capacitor is set at 5V, VH4 becomes around 20V using equation (1). Furthermore, in the present description, the threshold voltages of all the n type MOS transistors are given as Vth for the purpose of simplification.

In addition, by a capacitor (CD1) connected between the first latch control line (LAC1) and the node (N1), the voltage of the node (N1) rises together with a rise in the voltage of the first drive clock (φAC1) and becomes a voltage VDH3.

The voltage VDH3 is expressed by the following equation (2).

$$VDH3 = VL + VH2 \times (CD1/(CD1 + CN1S)) \tag{2}$$

Generally, because VL is a ground potential, the voltage VDH3 becomes lower than the voltage VH2 using the equation (2). Therefore, either the transistor (NMT2) is hardly switched on, or at least does not contribute to the final voltage of the node (N2). Here, CN1S is what is called a parasitic capacitance calculated by subtracting a capacitance (CD1) from the capacitance of the node (N1).

Here, because the voltage VH4 of the node (N2) which is a gate voltage of the transistor (NMT4) is higher than the threshold voltage Vth of the transistor (NMT4), the transistor (NMT4) becomes an on state.

At time (t5), when the second drive clock (φAC2) on the second latch control line (LAC2) changes from a L level voltage VL to a H level voltage VH2, the voltage of the node (N3) rises together with the voltage rise of the second drive clock (φAC2). Because the node (N3) and node (N2) are capacitor-coupled by the capacitor (CD2), the voltage of the node (N2) also rises together with the voltage rise of the node (N3) due to a boot strap effect.

The voltage VN2 of the node (N2) at this time is expressed by the following equation (3).

$$VH2 = VH4 + VN3 \times (CD2/(CD2 + CN2S)) \tag{3}$$

Here, VN3 is the voltage of the node (N3), and CN2S is a value calculated by subtracting a capacitance (CD2) from the capacitance of the node (N2), that is, parasitic capacitance of node (N2).

Here, by appropriately setting the value of the capacitance (CD2), the equation (4) below is satisfied with the transistor (NMT4) in an on state.

$$VN2 - VN3 > Vth \tag{4}$$

In this case, as is shown in FIG. 2, it is possible to set the final voltage of VN3 which is the voltage of the node (N3) to the voltage VH2 which is a H level voltage of the second drive clock (φAC2).

The voltage VN2, that is, final voltage VH2 (expressed as VH4') of the node (N2) at this time is expressed by the following equation (5).

$$VH4' = VH4 + VH2 \times (CD2/(CD2 + CN2S)) \tag{5}$$

At the same time, because the voltage VH4' is a gate voltage with respect to the transistor (NMT5), the voltage of the node (N4) also becomes the voltage VH2. For example, when the voltage VH2 is set to 25V, the node (N3) and node (N4) both become 25V.

At time (t6), when the first drive clock (φAC1) on the first latch control line (LAC1) changes from a H level voltage VH2 to a L level voltage VL, because the voltage of the node (N1) which is the gate voltage of the transistor (NMT2) becomes a L level voltage VL (=0V), the transistor (NMT2) becomes an off state.

Because the transistor (NMT3) is diode-connected, a current does not flow from the node (N2) to the first latch control line (LAC1). Therefore, the node (N2) maintains a voltage VH4'. Furthermore, exactly speaking, because the gate of the transistor (NMT2) changes from an H level to a L level, there is a small drop in voltage due to capacitance between the gate/drain of the transistor (NMT2), however, this change is so minimal that it is ignored in the present description.

At time (t7), when the second drive clock (φAC2) on the second latch control line (LAC2) changes from a H level voltage VH2 to a L level voltage VL, because the voltage of the node (N2) which is the gate voltage of the transistors (NMT4, NMT5) becomes a H level voltage VH4', the transistor (NMT4) and transistor (NMT5) become an on state.

In this way, the voltage of the nodes (N3, N4) drops according to a voltage drop of the second drive clock (φAC2). At this time, the voltage VN2 of the node (N2) also drops according to the equation (3). However, even if the voltage VN3 of the node (N3) becomes the voltage VL (for example, 0V in the present embodiment), the voltage (VN2) of the node (N2) is a voltage VH4, and the transistors (NMT4, NMT5) become a sufficiently low resistance on state. Therefore, the nodes (N3, N4) become a L level voltage VL during a relatively short time period.

The first output (OUT1) is set to a Low level voltage VL by the drive method described above. Therefore, when the latch circuit of the present embodiment is used in the movable shutter type display described above, the shutter (S) is attracted to the first output (OUT1) side between the time (t6) and (t7) by an electrostatic force. However, after time (t7), the shutter (S) is no longer attracted to the first output (OUT1) side by an electrostatic force. Therefore, the shutter (S) is positioned for example between the first output (OUT1) and second output (OUT2) by a spring force which supports the shutter (S).

At time (t8), when the third drive clock (φAC3) on the third latch control line (LAC3) changes from a L level voltage VL to a H level voltage VH3, the shutter (S) which is positioned between the first output (OUT1) and the second output (OUT2) is attracted to the H level voltage VH2 of the third drive clock (φAC3) by an electrostatic force, moves to the second output (OUT2) side and the setting of the shutter position is complete.

Next, on the right side of FIG. 2, the shutter setting sequence in the next sub frame after time (t11) is explained.

At time (t11), when a scanning voltage (φG) on a scan line (LG) changes from a L level voltage VL to a H level voltage VH1, an input transistor (NMT1) is switched on and the voltage of the node (N1) becomes the voltage (data: voltage VDH at time (t11)) on the data line (LD). Here, the voltage VDH is higher than the threshold voltage Vth of the transistor (NMT2), the voltage of the node (N2) flows at a desired time period, and is set to a voltage which can be set to the voltage VL, 7V for example.

In this way, the transistor (NMT2) becomes an on state and the voltage of the node (N2) becomes a voltage from VH4 to VL. At this time, after the transistor (NMT4) changes to an off state from an on state due to gate capacitance between the capacitor (CD2) and transistor (NMT4), the voltage of the node (N3) becomes a voltage slightly on the minus side. However, this is so minimal that it is ignored in FIG. 2. This is also the same with respect to the transistor (NMT5). However, there is no capacitance coupling such as the capacitor (CD2), and because there is only a small gate capacitance of the transistor (NMT5), this is also ignored in FIG. 2.

At time (t12), when a scanning voltage (φG) on a scan line (LG) changes to a L level voltage VL, the transistor (NMT1) is switched off and a programming operation to the node (N1) is complete.

At time (t13), the third drive clock (φAC3) on the third latch control line (LAC3) changes from a H level voltage VH3 to a L level voltage VL. In the case where the latch circuit of the present embodiment is used in a movable shutter type display described above, at this point in time, the position of the shutter (S) moves to an intermediate position between the first output (OUT1) and the second output (OUT2) by the force of a spring.

Next, at time (t14), the first drive clock (φAC1) on the first latch control line (LAC1) changes from a L level voltage VL to a H level voltage VH2. At this time, because the voltage of the node (N1) is VHD immediately before, the voltage of the node (N1) changes from VDH to VDH13 expressed in the equation (6).

$$VDH13=VDH+VH2\times(CD1/(CD1+CN1S)) \quad (6)$$

If the voltage VDH13 is higher than the voltage VH2, the voltage VN2 of the node (N2) becomes the voltage as described in equation (7) below and can become a voltage which is different to voltages after following time (t4). However, this difference is small and the final voltage of the node (N2) after time (t14) is written as the voltage VH4 in FIG. 5

$$VN2=VDH13-Vth \quad (7)$$

Other than this, the same phenomena occur at time (t14) and time (t15) as at time (t4) and time (t5), and up to time (t16) the voltage VN1 of the node (N1), the voltage VN2 of the node (N2) and the voltage VN3 of the node (N3) each become VN1=VDH13, VN2=VH4', VN3=VH2.

Next, at time (t16), the first drive clock (φAC1) on the first latch control line (LAC1) changes from a H level voltage VH2 to a L level voltage VL. At this time, because the transistor (NMT2) is in an on state, the voltage of the node (N2) changes from the voltage VH4' to VL. As a result, the transistors (NMT4) and (NMT5) are switched off.

Following this, at time (t17), the second drive clock (φAC2) on the second latch control line (LAC2) changes from a H level voltage VH2 to a L level voltage VL.

At time (t16), the voltage of the node (N3) also drops corresponding to the voltage change of the node (N2) due to the gate capacitance of the capacitor (CD2) and the transistor (NMT4), and the voltage of the node (N3) becomes a voltage from VH2 to VH12. The voltage VH12 is largely expressed by the equation (8) below.

$$VH12=VH2-VH4'\times((CD2+CGD4)/(CD2+CGD4+CN2S)) \quad (8)$$

Here, CGD4 is the gate/drain capacitance of the transistor (NMT4), and CN2S is the parasitic capacitance other than the capacitor (CD2) of the node (N2) and the gate/drain capacitance (CGD4) of the transistor (NMT4).

Because it is necessary to obtain a high gate voltage in order to charge node (N3) and node (N4) using an a-Si transistor and at high speed, the capacitor CD2 has a relatively large capacitance compared to the parasitic capacitance (CN2S, CN3S), and therefore, it is preferred to take up around 80% of the capacitance of the node (N2).

Therefore, the voltage VH12 provided in equation (8) sometimes changes to a significantly low voltage. For example, when CD2+CGD4≈CD2=4×CN2S, and VH2=25V, VH4=20V via equation (1), VH4'=40V via equation (5), and VH12=25-40×0.8=-7V via equation (8).

Actually, because the voltage of the node (N3) does not become lower than −Vth of the transistor (NMT4), a voltage of around −5V is sufficient. Therefore, even if the node (N3) is used as the first output (OUT1), a desired High state can not be created.

On the other hand, the voltage of the node (N4) receives an influence of the change of the node (N2). However, because the capacitance coupling at this time is only the capacitance between the gate/drain of the transistor (NMT5), the ratio which is taken up with respect to the capacitance of the node (N4) including a load of the first output (OUT1) is small and therefore the drop in voltage is small and it is possible to maintain a required voltage for a shutter operation.

For example, when the ratio of the capacitance between the gate/drain of the transistor (NMT5) with respect to the total capacitance of the node (N4) is 0.01, the voltage VN4 of the node (N4) becomes VN4=25-40×0.01=24.6V via equation (8).

In this way, because it is possible to design a voltage drop of the node (N4), this drop is ignored in FIG. 2. At this time, the shutter (S), moves to the first output (OUT1) side by an electrostatic source and this state is maintained at the point where the voltage of the node (N4) becomes at a H level.

At time (t18), even if the third drive clock (φAC3) on the third latch control line (LAC3) becomes at a H level voltage VH3, this state is maintained.

FIG. 3 is a block diagram which shows an approximate structure of a display (movable shutter type display) which displays an image by electrically controlling the position of the movable shutter (S) of embodiment one of the present invention.

The movable shutter type display shown in FIG. 3 is arranged two dimensionally in one pixel (PX), and the circuit shown in FIG. 1 is also arranged in each pixel. Here, a scan line (LG) is arranged in row units and is input to a perpendicular drive circuit (XDR).

In addition, a data line (LD) is arranged in column units and is input to a horizontal drive circuit (YDR). The first latch control line (LAC1), second latch control line (LAC2), third latch control line (LAC3), and shutter control line (LSS) are commonly arranged on each pixel and input to the horizontal drive circuit (YDR).

In the movable shutter type display shown in FIG. 3, data is programmed to each pixel on each row within a programming time period (TA in FIG. 2), the movable shutter (S) is moved to the first output (OUT1) or second output (OUT2) side in a movable shutter state setting time period (TB in FIG. 2) and an image is displayed in a display time period (TC in FIG. 2).

Embodiment Two

Figure 4:
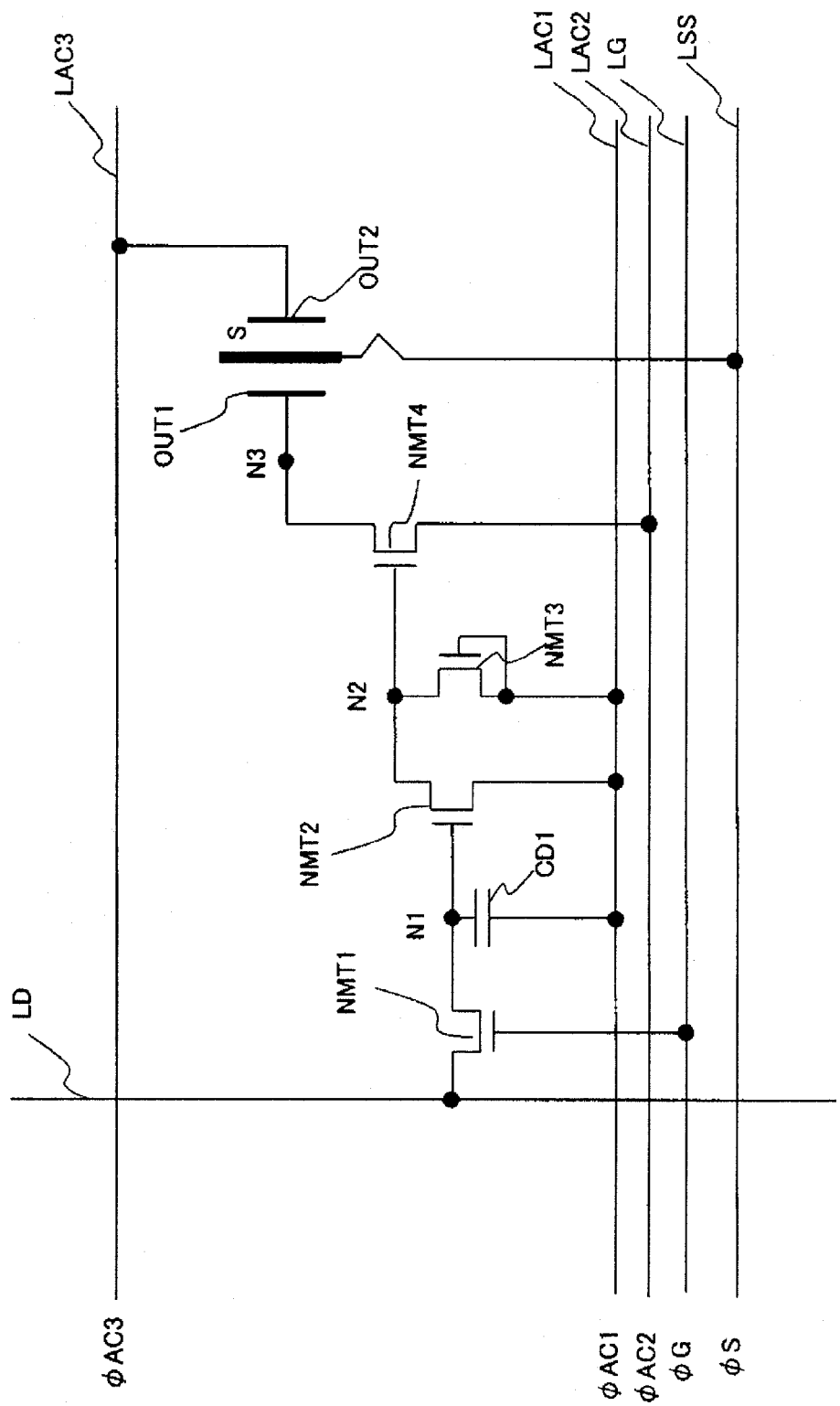
FIG. 4 is a circuit diagram which shows a circuit structure of a single channel latch circuit of embodiment two of the present invention

FIG. 4 is a circuit diagram which shows a circuit structure of a single channel latch circuit of embodiment two of the present invention The latch circuit shown in FIG. 4 does not include the capacitor (CD2) and transistor (NMT5) of the latch circuit shown in FIG. 1 and the node (N3) is the first output (OUT1).

Figure 5:
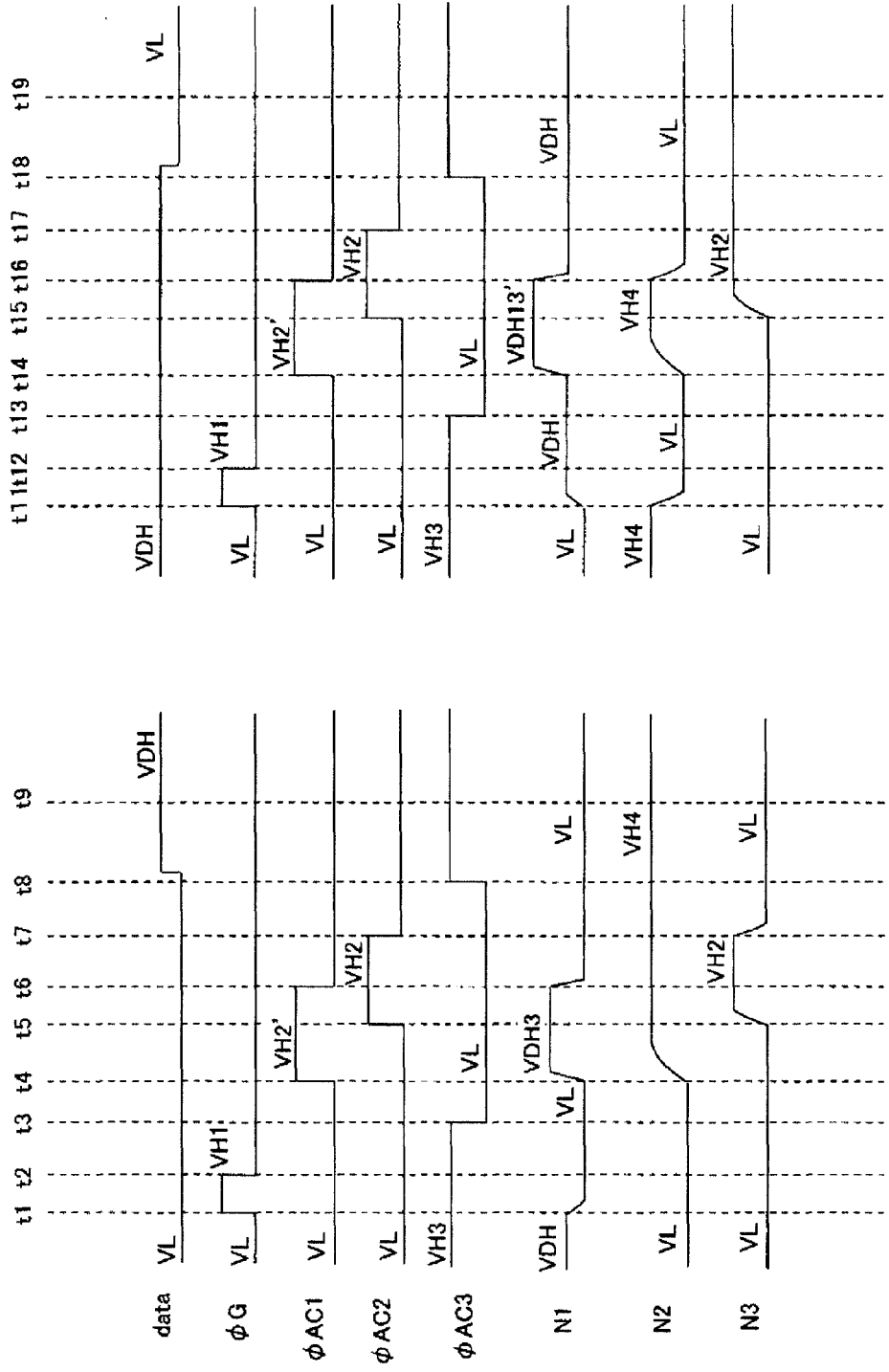
FIG. 5 is a timing chart which shows the time changes of a scanning voltage ($\phi G$), drive clock ($\phi AC1 \sim \phi AC3$), and each node (N1, N2, N3 and N4) of the latch circuit shown in FIG. 4.

The time changes of a scanning voltage (φG), first to third drive clocks (φAC1~φAC3), and each node (N1, N2, N3) of the latch circuit shown in FIG. 4 are shown in FIG. 5, At time (t1), when a scanning voltage (φG) on a scan line (LG) changes from a L level voltage VL to a H level voltage VH1, an input transistor (NMT1) is switched on and the voltage of the node (N1) becomes the voltage (data: voltage VL at time (t1)) on the data line (LD).

At time (t2), when the scanning voltage (φG) on the scan line (LG) changes to a L level voltage VL, the transistor (NMT1) is switched off and a programming operation to the node (N1) is complete.

In order to perform sufficient programming between time (t1) and time (t2), it is preferable that the voltage VH1 is a voltage of 15V or more the same as in embodiment one described above.

At time (t3), the third drive clock (φAC3) on the third latch control line (LAC3) changes from a H level voltage VH3 to a L level voltage VL. In the case where the latch circuit of the present embodiment is used as the movable shutter type display described above for example, at this point in time, the position of the shutter (S) moves to an intermediate position between the first output (OUT1) and second output (OUT2) with the force of a spring.

Next, at time (t4), when the first drive clock (φAC1) on the first latch control line (LAC1) changes from a L level voltage VL to a H level voltage VH2', the transistor (NMT3) which is diode-connected becomes an on state and the voltage of node (N2) is raised.

The final voltage VH4 of the node (N2) becomes VH4=VH2'−Vth via the equation (1) described above. Vth is a threshold voltage of the transistor (NMT3).

Here, because the voltage VH4 of the node (N2) which is a gate voltage of the transistor (NMT4) is higher than the threshold voltage Vth of the transistor (NMT4), the transistor (NMT4) becomes an on state.

At time (t5), when the second drive clock (φAC2) on the second latch control line (LAC2) changes from a L level voltage VL to a H level voltage VH2, the voltage of the node (N3) rises together with the voltage rise of the second drive clock (φAC2).

Here, when the H level voltages of the first drive clock (φAC1), second drive clock (φAC2), and third drive clock (φAC3) are set as the same voltage VH2, the node (N2) which becomes at the gate voltage of the transistor (NMT4) becomes at a maximum voltage (VH2−Vth), and as a result, the maximum value (VN3max) of the voltage of the node (N3) becomes VN3max=VH2−Vth−Vth, the voltage drops significantly and speed becomes slower. For example, VN3max=15V when VH2=25V, Vth=5V.

Thus, in the present embodiment, the H level voltage of the first drive clock (φAC1) is set as the second drive clock (φAC3), and is set to a higher voltage (for example, VH2'=VH2+2 Vth) than the H level voltage VH2 of the third drive clock (φAC3).

In this way, the final voltage of the node (N3) can be set as the voltage VH2 which is the H level voltage of the second drive clock (φAC2).

At time (t6), when the first drive clock (φAC1) on the first latch control line (LAC1) changes from a H level voltage VH2' to a L level voltage VL, because the voltage of the node (N1) which is the gate voltage of the transistor (NMT2) becomes a L level voltage VL (for example 0V), the transistor (NMT2) is switched off.

Because the transistor (NMT3) is diode-connected, a current does not flow from the node (N2) to the first latch control line (LAC1). Therefore, the node (N2) maintains a voltage VH4. Furthermore, exactly speaking, because the gate of the transistor (NMT2) changes from an H level voltage to a L level voltage, there is a small drop in voltage due to capacitance between the gate/drain of the transistor (NMT2), however, this change is so minimal that it is ignored in the present description.

At time (t7), when the second drive clock (φAC2) on the second latch control line (LAC2) changes from a H level voltage VH2 to a L level voltage VL, because the voltage of the node (N2) which is the gate voltage of the transistor (NMT4) becomes a H level voltage VH4, the transistor (NMT4) is maintained in an on state.

In this way, the voltage of the node (N3) drops according to a voltage drop of the second drive clock (φAC2). In this case, the voltage of the node (N2) is a voltage VH4, and the transistor (NMT4) becomes at a sufficiently low resistance on state. Therefore, the node (N3) becomes at a L level voltage VL during a relatively short time period.

The first output (OUT1) is set to a Low level voltage VL by the drive method described above. Therefore, when the latch circuit of the present embodiment is used in the movable shutter type display described above, the shutter (S) is attracted to the first output (OUT1) side between the time (t6) and (t7) by an electrostatic force. However, after time (t7), the shutter (S) is no longer attracted to the first output (OUT1) side by an electrostatic force. Therefore, the shutter (S) is positioned for example between the first output (OUT1) and second output (OUT2) by a spring force which supports the shutter (S).

At time (t8), when the third drive clock (φAC3) on the third latch control line (LAC3) changes to a H level voltage VH3, the shutter (S) which is positioned between the first output (OUT1) and the second output (OUT2) is attracted to the H level voltage VH2 of the third drive clock (φAC3) by an electrostatic force, moves to the second output (OUT2) side and the setting of the shutter position is complete.

Next, on the right side of FIG. 5, the shutter setting sequence in the next sub frame after time (t11) is explained.

At time (t11), when a scanning voltage (φG) on a scan line (LG) changes from a L level voltage VL to a H level voltage VH1, an input transistor (NMT1) is switched on and the voltage of the node (N1) becomes the voltage (data: voltage VDH at time (t11)) on the data line (LD). Here, the voltage VDH is higher than the threshold voltage Vth of the transistor (NMT2), the voltage of the node (N2) flows at a desired time period, and is set to a voltage which can be set to the voltage VL, 7V for example. In this way, the transistor (NMT2) becomes an on state, and the voltage of the node (N2) becomes a voltage from VH4 to VL.

At time (t12), when a scanning voltage (φG) on a scan line (LG) changes to a L level voltage VL, the transistor (NMT1) is switched off and a programming operation to the node (N1) is complete.

At time (t13), the third drive clock (φAC3) on the third latch control line (LAC3) changes from a H level voltage VH3 to a L level voltage VL. As described above, in the case where the latch circuit of the present embodiment is used in a movable shutter type display described above, at this point in time, the position of the shutter (S) moves to an intermediate position between the first output (OUT1) and the second output (OUT2) by the force of a spring.

Next, at time (t14), the first drive clock (φAC1) on the first latch control line (LAC1) changes from a L level voltage VL to a H level voltage VH2'. At this time, the voltage of the node (N1) becomes the voltage VDH13' (=VHD+VH2'). Other than this, the same phenomena occur at time (t14) and time (t15) as at time (t4) and time (t5), and up to time (t16) the voltage VN1 of the node (N1), the voltage VN2 of the node (N2) and the voltage VN3 of the node (N3) each become VN1=VDH13', VN2=VH4, VN3=VH2.

Next, at time (t16), the first drive clock (φAC1) on the first latch control line (LAC1) changes from a H level voltage VH2' to a L level voltage VL. At this time, because the transistor (NMT2) is in an on state, the voltage of the node (N2) changes from the voltage VH4 to VL. As a result, the transistor (NMT4) is switched off.

Following this, at time (t17), when the second drive clock (φAC2) on the second latch control line (LAC2) changes from a H level voltage VH2 to a L level voltage VL, because the voltage of the node (N2) which is the gate voltage of the transistor (NMT4) is a L level voltage VL, the transistor (NMT4) is maintained in an off state and the node (N3) is maintained at the voltage VH2.

At this time, the shutter (S) moves to the first output (OUT1) side by an electrostatic force at the point where the voltage of the node (N3) becomes a H level, and this state is maintained.

At time (t18), even if the third drive clock (φAC3) on the third latch control line (LAC3) becomes a H level voltage VH3 from a L level voltage VL, this state is maintained.

In the present embodiment, compared to embodiment one described above, a setting voltages increase and further setting of high voltages is required. However, compared to embodiment one, it is possible to remove the capacitor (CD2) and transistor (NMT5) which are structural components of the latch circuit.

Furthermore, the case an n type MOS transistor using a thin film transistor including amorphous silicon semiconductor layers was explained above. However, in each of the embodiments above, it is also possible to use a thin film transistor including polysilicon semiconductor layers as the n type MOS transistor.

Furthermore, in the case of using a thin film transistor including polysilicon semiconductor layers, it is possible to use a p type MOS transistor instead of an n type MOS transistor.

Figure 6:
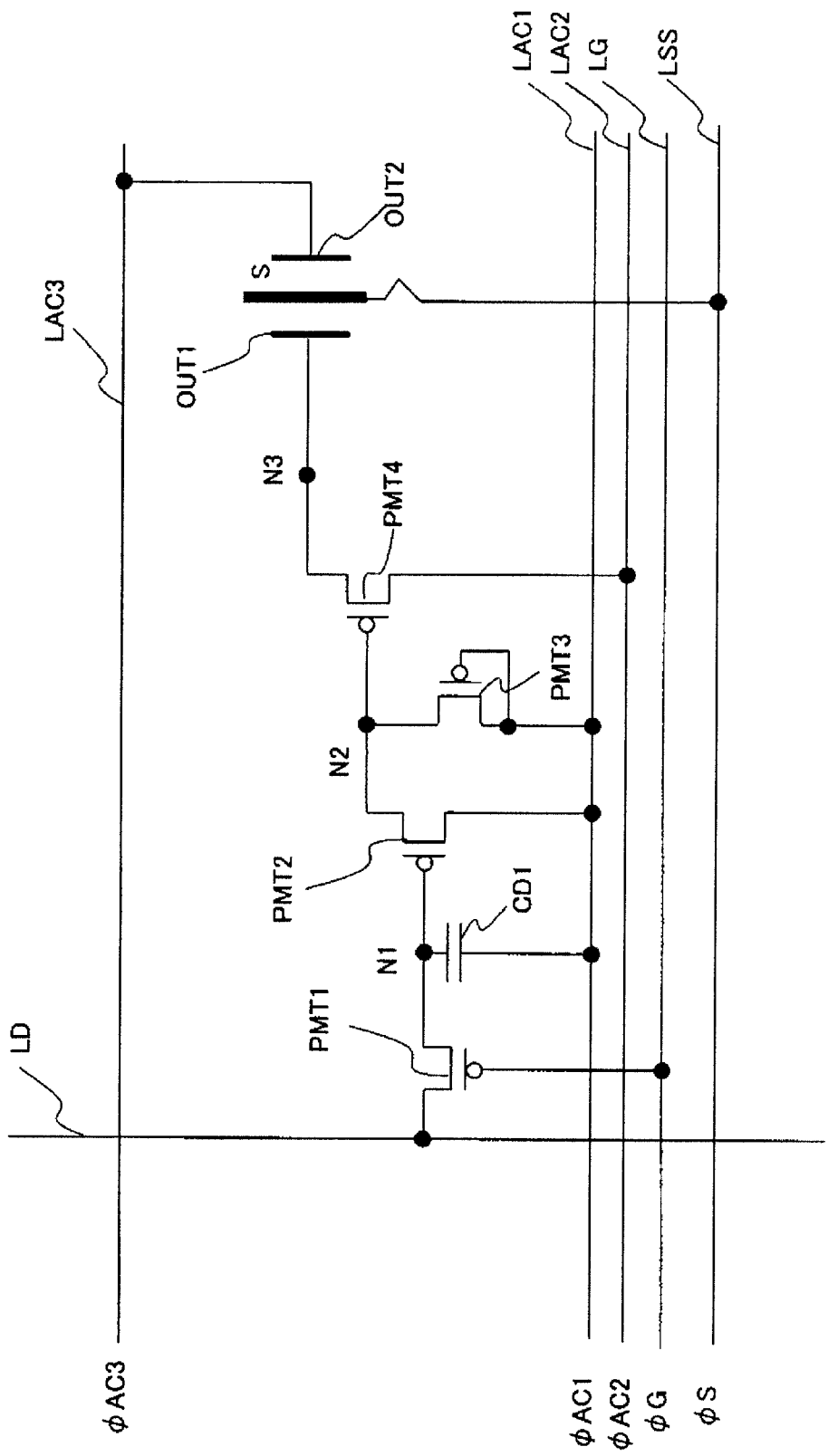
FIG. 6 is a circuit diagram which shows a modified circuit structure of a single channel latch circuit of embodiment two of the present invention.

A circuit structure in the case where the single channel latch circuit shown in FIG. 4 is formed using a p type MOS transistor in FIG. 6.

First, the case where a voltage (data) on a data line (LD) is a L level voltage VDL is explained.

At time (t1), when a scanning voltage (φG) on a scan line (LG) changes from a H level voltage VH to a L level voltage VL1 (also called "a scanning voltage is input"), an input transistor (PMT1) is switched on and the voltage of the node (N1) becomes the voltage (data: voltage VDL at time (t1)) on the data line (LD).

When the voltage of the node (N1) changed to the voltage VDL, the transistor (PMT2) becomes an on state and the voltage of the node (N2) becomes a voltage VH.

At time (t2), when the scanning voltage (φG) on the scan line (LG) changes to a H level voltage VH, the transistor (PMT1) is switched off and a programming operation to the node (N1) is complete.

At time (t3), the third drive clock (φAC3) on the third latch control line (LAC3) changes from a H level voltage VH to a L level voltage VL3. In the case where the latch circuit of the present embodiment is used as the movable shutter type display described above for example, at this point in time, the position of the shutter (S) moves to an intermediate position between the first output (OUT1) and second output (OUT2) with the force of a spring.

Next, at time (t4), when the first drive clock (φAC1) on the first latch control line (LAC1) changes from a H level voltage VH to a L level voltage VL2, the transistor (PMT3) which is diode-connected becomes an on state and the voltage of node (N2) is dropped.

The final voltage VL4 of the node (N2) becomes VL4=VL2+Vth. Vth is a threshold voltage of the transistor (PMT3).

Here, because the voltage VL4 of the node (N2) which is a gate voltage of the transistor (PMT4) is lower than the threshold voltage Vth of the transistor (PMT4), the transistor (PMT4) becomes an on state.

In addition, the voltage of the node (N1) also drops and the node (N1) becomes at a voltage VDL2=(VDL−VL2).

At time (t5), when the second drive clock (φAC2) on the second latch control line (LAC2) changes from a H level voltage VH to a L level voltage VL3, because the transistor (PMT4) is in an on state, the voltage of the node (N3) drops together with the voltage drop of the second drive clock (φAC2).

Here, when the L level voltages of the first drive clock (φAC1), second drive clock (φAC2), and third drive clock (φAC3) are set as the same voltage (expressed by VL), the node (N2) which becomes at the gate voltage of the transistor (PMT4) becomes at a minimum voltage (VL+Vth), and as a result, the minimum value (VN3min) of the voltage of the node (N3) becomes VN3min=VL+Vth+Vth, the voltage rises significantly and speed becomes slower.

Thus, in the present embodiment, the L level voltage of the first drive clock (φAC1) is set to a lower voltage than the L level voltage of the second drive clock (φAC2), for example, VL2=VL3−2 Vth.

In this way, the final voltage of the node (N3) can be set as the voltage VL3 which is the L level voltage of the second drive clock (φAC2).

At time (t6), when the first drive clock (φAC1) on the first latch control line (LAC1) changes from a L level voltage VL2 to a H level voltage VH, because the voltage of the node (N1) which is the gate voltage of the transistor (PMT2) becomes a L level voltage VDL, the transistor (PMT2) is maintained in an on state.

Because the transistor (PMT3) is diode-connected, a current does not flow from the first latch control line (LAC1) to the node (N2). Therefore, the node (N2) is charged via the transistor (PMT2) and becomes at a voltage VH.

As a result, the transistor (PMT4) is switched off. Furthermore, exactly speaking, because the gate of the transistor (PMT2) changes from an L level voltage to H level voltage, there is a small rise in voltage due to capacitance between the gate/drain of the transistor (PMT2), however, this change is so minimal that it is ignored in the present description.

At time (t7), when the second drive clock (φAC2) on the second latch control line (LAC2) changes from a L level voltage VL3 to a H level voltage VH, because the transistor (PMT4) is switched off, the node (N3) is maintained at a L level voltage VL3.

Figure 7:
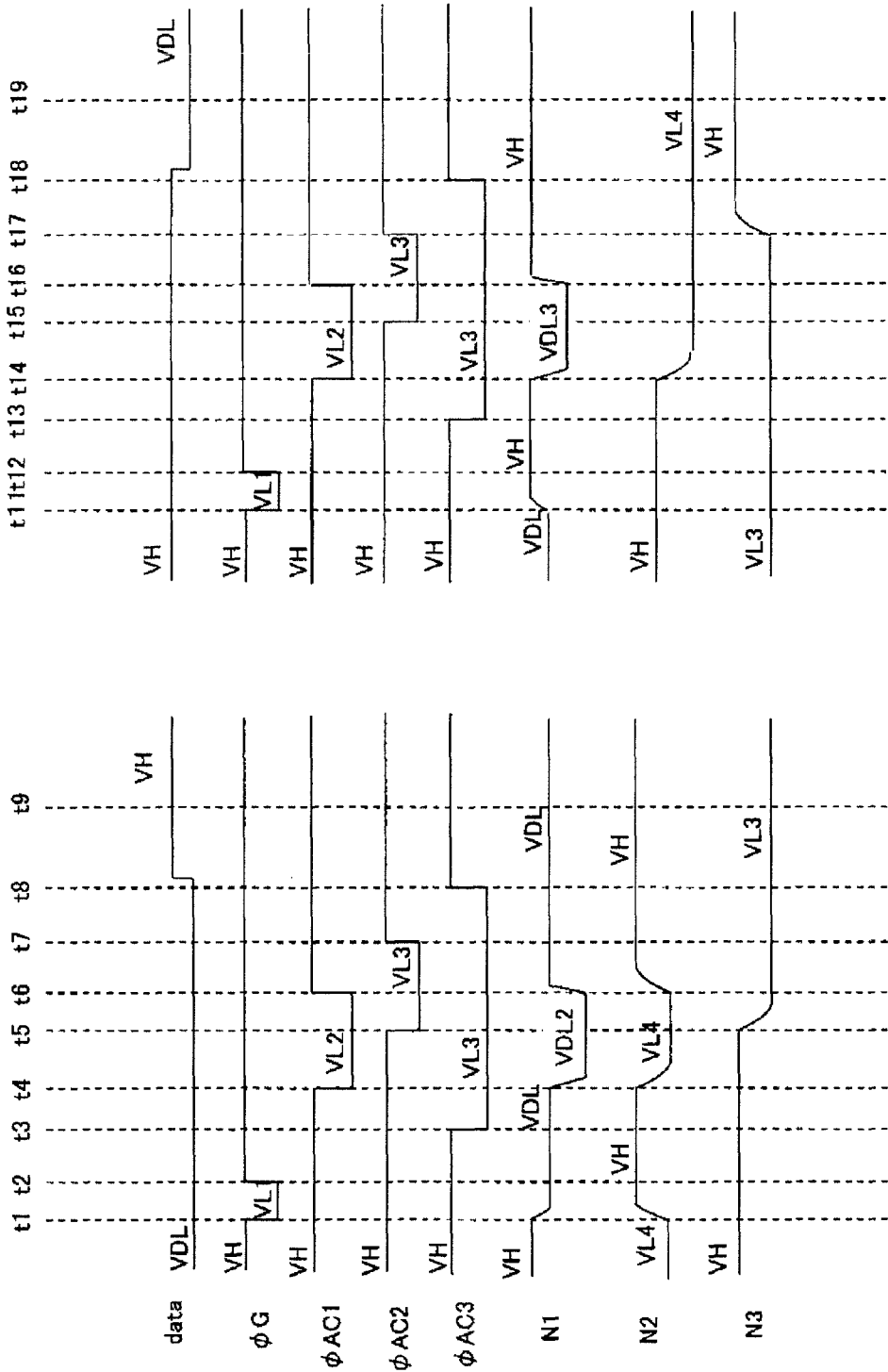
FIG. 7 is a timing chart which shows the time changes of a scanning voltage ($\phi G$), drive clock ($\phi AC1, \phi AC3, \phi AC3$), and each node (N1, N2, N3) of the latch circuit shown in FIG. 6.
Figure 8:
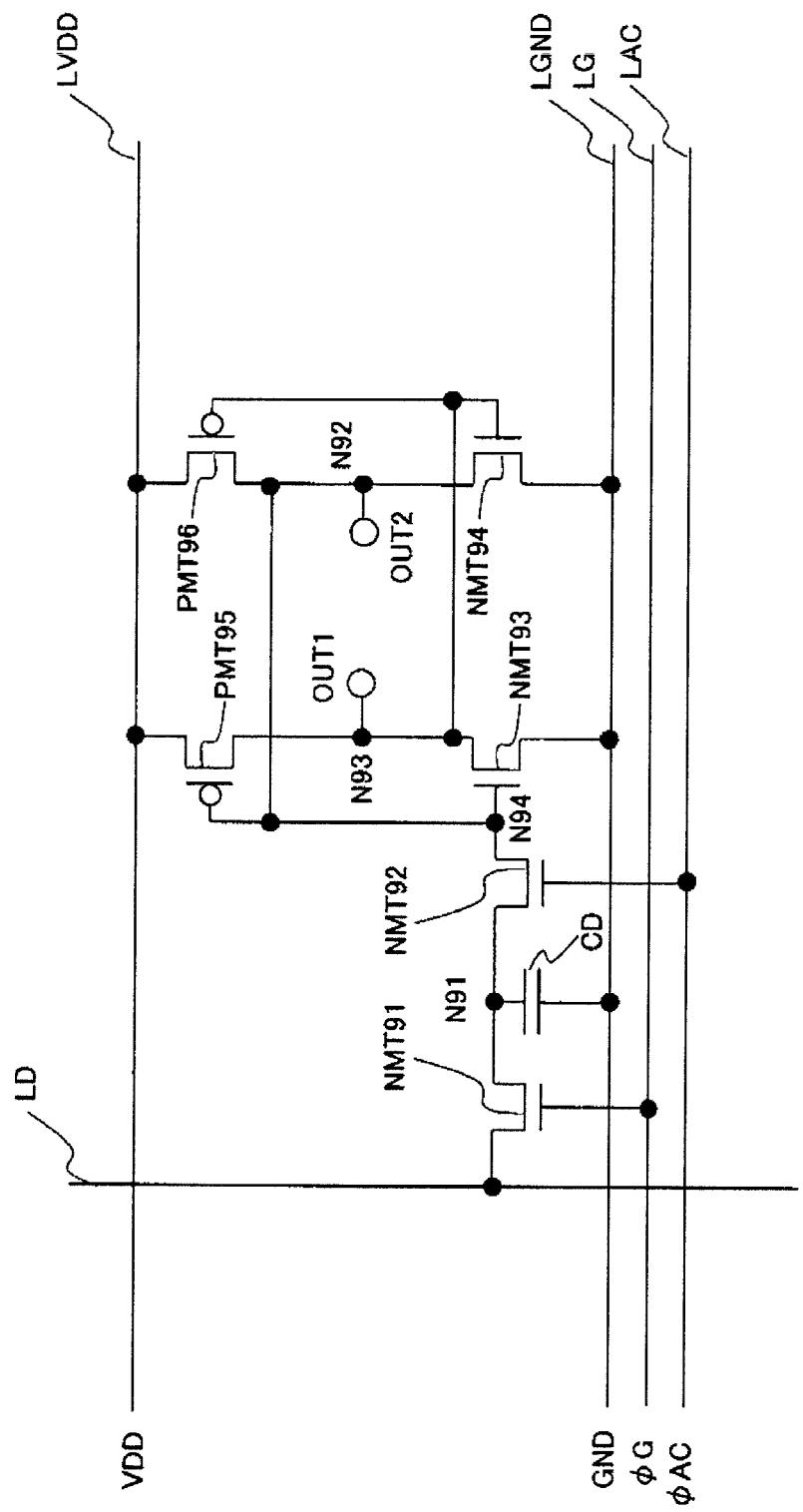
FIG. 8 is a circuit diagram which shows a circuit structure of a latch circuit formed by a conventional CMOS circuit.
Figure 9:
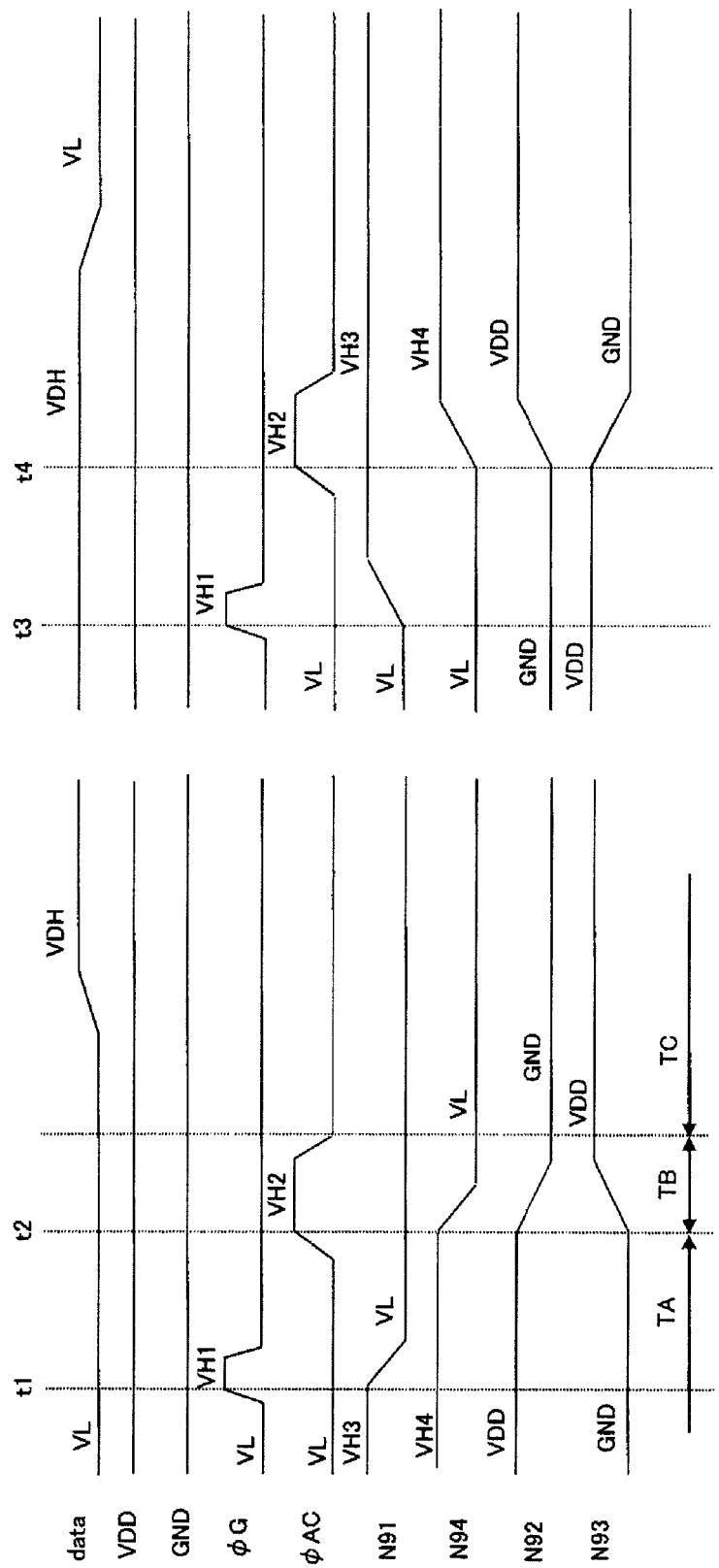
FIG. 9 is a timing chart which shows the time changes of a scanning voltage ($\phi G$), drive clock ($\phi AC1$), and each node (N91, N92, N93 and N94) shown in FIG. 8.
Figure 10:
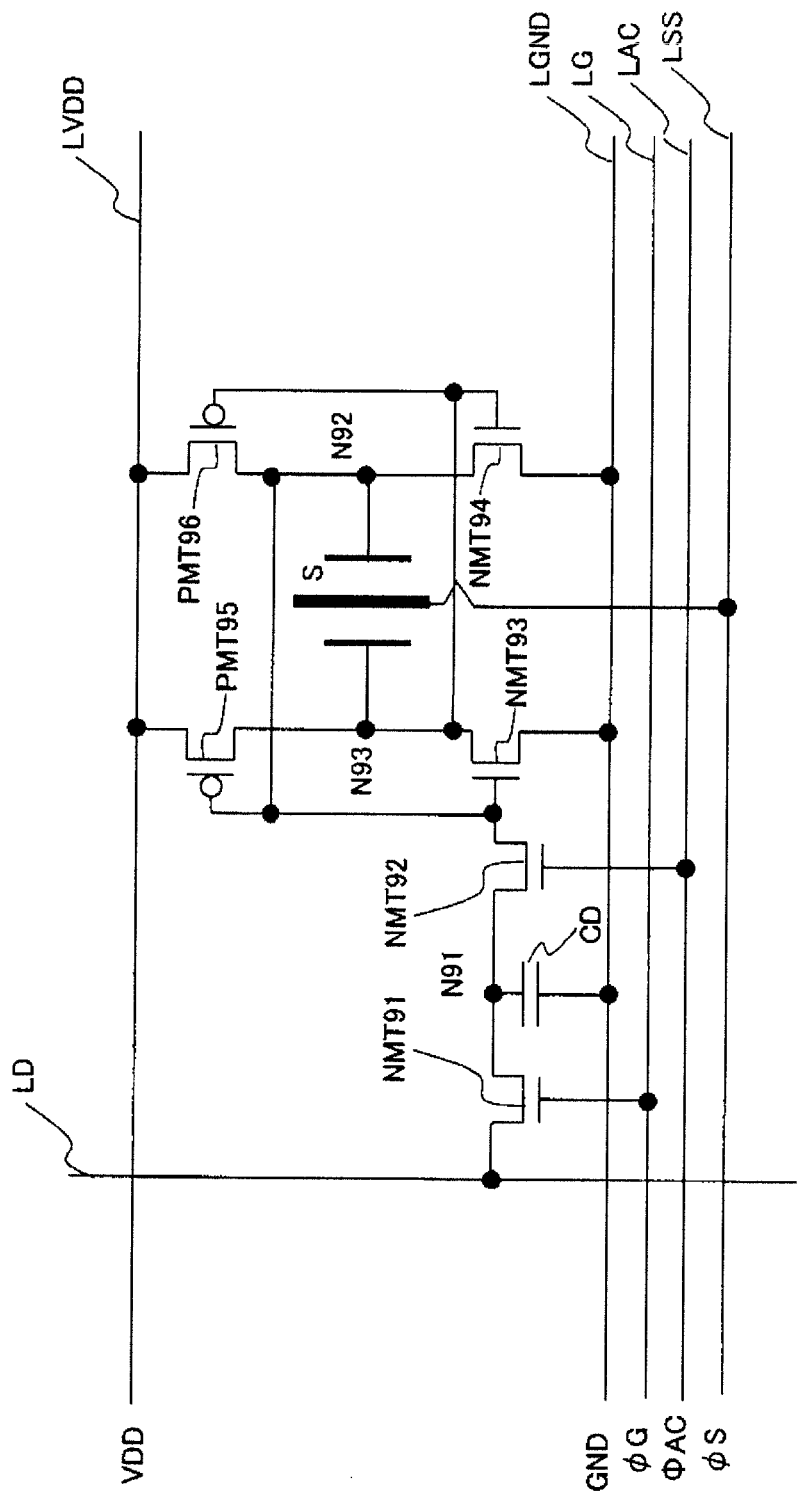
FIG. 10 is a circuit diagram which shows an approximate structure of a pixel circuit of a display which displays an image by electrically controlling the position of a movable shutter (S).

Next, on the right side of FIG. 7, the shutter setting sequence in the next sub frame after time (t11) is explained.

At time (t11), when a scanning voltage (φG) on a scan line (LG) changes from a H level voltage VH to a L level voltage VL1, an input transistor (PMT1) is switched on and the voltage of the node (N1) becomes the voltage (data: voltage VH at time (t11)) on the data line (LD).

At time (t12), when a scanning voltage (φG) on a scan line (LG) changes to a H level voltage VH, the transistor (PMT1) is switched off and a programming operation to the node (N1) is complete.

At time (t13), the third drive clock (φAC3) on the third latch control line (LAC3) is changed from a H level voltage VH to a L level voltage VL3. As described above, in the case where the latch circuit of the present embodiment is used in a movable shutter type display described above, at this point in time, the position of the shutter (S) moves to an intermediate position between the first output (OUT1) and the second output (OUT2) by the force of a spring.

Next, at time (t14), the first drive clock (φAC1) on the first latch control line (LAC1) changes from a H level voltage VH to a L level voltage VL2. At this time, because the voltage of the node (N1) immediately before is VH, the voltage of the node (N1) becomes the voltage VDL3 (=VH−VL2).

Other than this, the same phenomena occur at time (t14) and time (t15) as at time (t4) and time (t5), and up to time (t16) the voltage VN1 of the node (N1), the voltage VN2 of the node (N2) and the voltage VN3 of the node (N3) each become VN1=VDL3, VN2=VVL4, VN3=VL3.

Next, at time (t16), the first drive clock (φAC1) on the first latch control line (LAC1) changes from a L level voltage VL2 to a H level voltage VH. At this time, the transistor (PMT2) is in an off state, and because the transistor (PMT3) is diode-connected, a current does not flow from the first latch control line (LAC1) to the node (N2). Therefore, the node (N2) maintains a voltage VL4. Furthermore, exactly speaking, because the gate of the transistor (PMT2) changes from an L level to a H level, there is a small rise in voltage due to capacitance between the gate/drain of the transistor (PMT2), however, this change is so minimal that it is ignored in the present description.

Following this, at time (t17), when the second drive clock (φAC2) on the second latch control line (LAC2) changes from a L level voltage VL3 to a H level voltage VH, because the voltage of the node (N2) which is the gate voltage of the transistor (PMT4) is a L level voltage VL4, the transistor (PMT4) is switched on and the node (N3) becomes at a voltage VH.

At this time, the shutter (S) moves to the first output (OUT1) side by an electrostatic force at the point where the voltage of the node (N4) becomes a H level, and this state is maintained.

At time (t18), even if the third drive clock (φAC3) on the third latch control line (LAC3) becomes a H level voltage VH, this state is maintained.

Furthermore, the case where the latch circuit of the present invention is used in a movable shutter type display was explained. However, the present invention can also be applied to other displays which required similar operations other than a circuit of a movable shutter type display.

While the invention realized by the inventors was explained in detail based on the embodiments above, the present invention is not limited to the embodiments and various changes and modifications may be made without departing from the idea of the embodiments.

What is claimed is:

1. A latch circuit for receiving and latching data in response to an input scanning signal comprising: a first latch control line receiving a first drive clock; a second latch control line receiving a second drive clock; an input transistor having a gate and first and second electrodes, the first electrode of the input transistor receiving a data signal corresponding to 0 data or 1 data in response to the scanning signal supplied to the gate of the input transistor; a first capacitor retaining a voltage of the data signal received by the input transistor, the first capacitor being directly connected between the second electrode of the input transistor and the first latch control line; a first transistor having a gate and first and second electrodes, the first transistor being a first conductivity type, the first electrode of the first transistor being directly connected to the first latch control line and the gate of the first transistor being directly connected to the second electrode of the input transistor; a second transistor having a gate and first and second electrodes, the second transistor being the first conductivity type, the gate of the second transistor being directly connected to the second electrode of the first transistor and the first electrode of the second transistor being directly connected to the second latch control line; a third transistor having a gate and first and second electrodes, the third transistor being the first conductivity type, the gate of the third transistor being directly connected to the second electrode of the first transistor, the first electrode of the third transistor being connected to the second electrode of the second transistor, and the second electrode of the third transistor being directly connected to an output terminal; a second capacitor directly connected between the second electrode of the first transistor and the second electrode of the second transistor; and a diode directly connected between the second electrode of the first transistor and the first latch control line.

2. A latch circuit according to claim 1, wherein the first drive clock changes from a first voltage to a second voltage after the scanning signal is input, the second drive clock changes from the first voltage to the second voltage after the first drive clock changes from the first voltage to the second voltage, the second drive clock changes from the second voltage to the first voltage after the first drive clock changes from the second voltage to the first voltage, and the voltage of the output terminal changes to the second voltage in response to the second drive clock changed from the first voltage to the second voltage, and the voltage of the output terminal changes to the second voltage or the first voltage according to an on or off state of the first transistor in response to the second drive clock changed from the second voltage to the first voltage.

3. A latch circuit according to claim 2, wherein the diode is formed by a diode-connected transistor, and the input transistor, the first transistor, the second transistor, the third transistor and the diode are n type transistors and the second voltage is a voltage having a higher potential than the first voltage.

4. A latch circuit according to claim 1, wherein the diode is formed by a diode-connected transistor, and
the input transistor, the first transistor, the second transistor, the third transistor and the diode are thin film transistors including amorphous silicon semiconductor layers.

5. A latch circuit for receiving and latching data in response to an input scanning signal comprising: a first latch control line receiving a first drive clock; a second latch control line receiving a second drive clock; an input transistor having a gate and first and second electrodes, the first electrode of the input transistor receiving a data signal corresponding to [0] data or [1] data in response to the scanning signal supplied to the gate of the input transistor; a first capacitor retaining a voltage of the data signal received by the input transistor, the first capacitor being directly connected between the second electrode of the input transistor and the first latch control line; a first transistor having a gate and first and second electrodes, a first transistor being a first conductivity type, the first electrode of the first transistor being directly connected to the first latch control line and the gate of the first transistor being directly connected to the second electrode of the input transistor; a second transistor having a gate and first and second electrodes, the second transistor being the first conductivity type, the gate of the second transistor being directly connected to the second electrode of the first transistor and the first electrode of the second transistor being directly connected to the second latch control line; and a diode directly connected between the second electrode of the first transistor and the first latch control line.

6. A latch circuit according to claim 5, wherein the first drive clock changes from a first voltage to a second voltage after the scanning signal is input, the second drive clock changes from a third voltage to a fourth voltage after the first drive clock changes from the first voltage to the second voltage, the second drive clock changes from the fourth voltage to the third voltage after the first drive clock changes from the second voltage to the first voltage, and the voltage of the output terminal becomes the fourth voltage when the second drive clock changes from the third voltage to the fourth voltage, and becomes the fourth voltage or third voltage according to an on or off state of the first transistor when the second drive clock changes from the fourth voltage to the third voltage.

7. A latch circuit according to claim 6, wherein the diode is formed by a diode-connected transistor, and the input transistor, the first transistor, the second transistor and the diode are n type transistors and the second voltage is a voltage having a higher potential than the first voltage, and the fourth voltage is a voltage having a higher potential than the third voltage.

8. A latch circuit according to claim 5, wherein the first drive clock changes from a first voltage to a second voltage after the scanning signal is input, the second drive clock changes from the third voltage to the fourth voltage after the first drive clock changes from the first voltage to the second voltage, the second drive clock changes from the fourth voltage to the third voltage after the first drive clock changes from the second voltage to the first voltage, and $|VH1| \geq |VH2 + 2 \times Vth|$ is satisfied when the second voltage of the first drive clock is VH1, the fourth voltage of the second drive clock is VH2 and Vth is a threshold voltage of a transistor.

9. A latch circuit according to claim 5, wherein the diode is formed by a diode-connected transistor, and the input transistor, the first transistor, the second transistor and the diode are thin film transistors formed by amorphous silicon semiconductor layers.

10. A display device arranged with a plurality of pixels each having a movable shutter, the display device displaying an image by electrically controlling a position of the movable shutter, and each pixel includes a pixel circuit electrically controlling a position of the movable shutter, the pixel circuit including a first output terminal, a second output terminal, a latch circuit directly connected to the first output terminal of the pixel circuit, the latch circuit receiving and latching data in response to an input scanning signal comprising: a first latch control line receiving a first drive clock; a second latch control line receiving a second drive clock; an input transistor having a gate and first and second electrodes, the first electrode of the input transistor receiving a data signal corresponding to 0 data or 1 data in response to the scanning signal supplied to the gate of the input transistor; a first capacitor retaining a voltage of the data signal received by the input transistor, the first capacitor being directly connected between the second electrode of the input transistor and the first latch control line; a first transistor having a gate and first and second electrodes, the first transistor being a first conductivity type, the first electrode of the first transistor being directly connected to the first latch control line and the gate of the first transistor being directly connected to the second electrode of the input transistor; a second transistor having a gate and first and second electrodes, the second transistor being the first conductivity type, the gate of the second transistor being directly connected to the second electrode of the first transistor and the first electrode of the second transistor being directly connected to the second latch control line; a third transistor having a gate and first and second electrodes, the third transistor being the first conductivity type, the gate of the third transistor being directly connected to the second electrode of the first transistor, the first electrode of the third transistor being connected to the second electrode of the second transistor, and the second electrode of the third transistor being directly connected to the first output terminal; a second capacitor directly connected between the second electrode of the first transistor and the second electrode of the second transistor; and a diode directly connected between the second electrode of the first transistor and the first latch control line, and a third latch control line directly connected to the second output terminal of the pixel circuit and receiving a third drive clock.

11. A display device according to claim 10, wherein the first drive clock changes from a first voltage to a second voltage after the scanning signal is input, the second drive clock changes from the first voltage to the second voltage after the first drive clock changes from the first voltage to the second voltage, the second drive clock changes from the second voltage to the first voltage after the first drive clock changes from the second voltage to the first voltage, and the voltage of the second output terminal becomes the second voltage when the second drive clock changes from the first voltage to the second voltage, and becomes the second voltage or first voltage according to an on or off state of the first transistor when the second drive clock changes from the second voltage to the first voltage.

12. A display device according to claim 11, wherein the diode is formed by a diode-connected transistor, and
the input transistor, the first transistor, the second transistor, the third transistor and the diode are n type transistors and the second voltage is a voltage having a higher potential than the first voltage.

13. A display device according to claim 10, wherein the diode is formed by a diode-connected transistor, and the input transistor, the first transistor, the second transistor, the third transistor and the diode are thin film transistors formed by amorphous silicon semiconductor layers.

14. A display device according to claim 10, wherein the third drive clock changes to a first voltage from a second voltage and changes from the first voltage to the second voltage, and the third drive clock is confirmed to be a voltage output from the latch circuit to the first output terminal within a time period of the first voltage.

* * * * *